United States Patent [19]
Yoshino et al.

[11] Patent Number: 5,446,321
[45] Date of Patent: Aug. 29, 1995

[54] BICMOS TRI-STATE CIRCUIT WITH FULL OUTPUT VOLTAGE SWING

[75] Inventors: Toshiaki Yoshino; Kwok K. Chau, both of Dallas, Tex.

[73] Assignee: Texas Instruments Incorporated, Dallas, Tex.

[21] Appl. No.: 83,210

[22] Filed: Jun. 25, 1993

Related U.S. Application Data

[63] Continuation of Ser. No. 989,929, Dec. 11, 1992, abandoned, which is a continuation of Ser. No. 758,434, Sep. 3, 1991, abandoned, which is a continuation of Ser. No. 540,542, Jun. 19, 1990, abandoned.

[51] Int. Cl.⁶ ................................................ H03K 17/16
[52] U.S. Cl. ........................................ 326/57; 326/84; 327/408
[58] Field of Search ............ 307/443, 446, 473, 296.4, 307/546

[56] References Cited

U.S. PATENT DOCUMENTS

| | | | |
|---|---|---|---|
| 4,725,987 | 2/1988 | Hara et al. | 307/473 |
| 4,999,523 | 3/1991 | Cham et al. | 307/570 |
| 5,047,669 | 9/1991 | Iwamura et al. | 307/473 |

*Primary Examiner*—Margaret R. Wambach
*Attorney, Agent, or Firm*—Douglas A. Sorensen; Richard L. Donaldson; William E. Hiller

[57] ABSTRACT

A tri-state driver circuit is disclosed which provides rail-to-rail output swings and does not consume a significant amount of d.c. power.

17 Claims, 8 Drawing Sheets

| TRANSISTOR | EN=0, EN_=1, IN=0 | EN=0, EN_=1, IN=1 | EN=1, EN_=1, IN=1 | EN=1, EN_=0, IN=0 | EN=1, EN_=0, IN=1 |
|---|---|---|---|---|---|
| 10 | ON  | OFF | OFF | ON   | OFF |
| 2  | OFF | OFF | OFF | ON   | ON  |
| 14 | OFF | OFF | OFF | OFF+ | ON- |
| 22 | OFF | ON  | ON  | OFF  | ON  |
| 16 | ON  | ON  | ON  | OFF  | OFF |
| 12 | OFF | ON  | OFF | OFF  | ON  |
| 4  | OFF | OFF | OFF | ON   | ON  |
| 18 | ON  | ON  | ON  | ON-  | ON  |
| 6  | OFF | OFF | OFF | OFF  | OFF |
| 8  | OFF | OFF | OFF | OFF  | ON- |

ON- = ON initially and OFF eventually at steady state
OFF+ = OFF initially and ON eventually at steady state

Fig. 2

| EN | EN_ | IN | OUT |
|----|-----|----|----|
| 0 | 1 | 0 | HIGH IMPEDANCE STATE |
| 0 | 1 | 1 | HIGH IMPEDANCE STATE |
| 1 | 0 | 0 | 1 |
| 1 | 0 | 1 | 0 |
Fig. 3
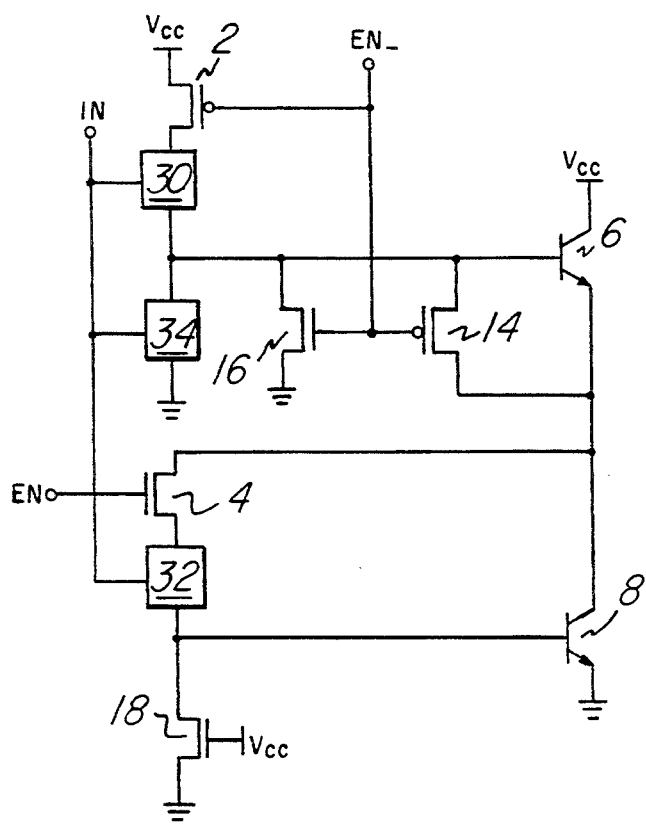
Fig. 4
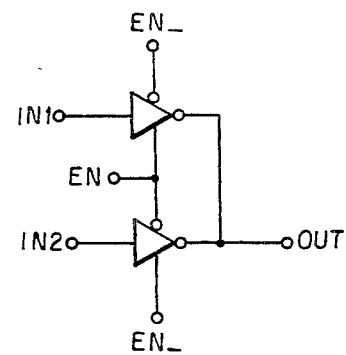
Fig. 5a

NAND TRI-STATE

| EN_ | EN | IN1 | IN2 | 2 | 44 | 10 | 22 | 16 | 42 | 14 | 6 | 40 | 4 | 12 | 18 | 8 | OUT |
|---|---|---|---|---|---|---|---|---|---|---|---|---|---|---|---|---|---|
| 0 | 1 | 0 | 0 | ON | ON | ON | OFF | OFF | OFF | OFF+ | ON- | ON | OFF | OFF | ON | OFF | 1 |
| 0 | 1 | 0 | 1 | OFF | ON | ON | OFF | ON | OFF | OFF+ | ON- | ON | ON | OFF | ON | OFF | 1 |
| 0 | 1 | 1 | 0 | ON | ON | OFF | ON | OFF | OFF | OFF+ | ON- | ON | OFF | ON | ON | OFF | 1 |
| 0 | 1 | 1 | 1 | OFF | ON | OFF | ON | ON | OFF | ON- | OFF | OFF | ON | OFF | ON | ON- | 0 |
| 1 | 0 | 0 | 0 | ON | OFF | ON | OFF | OFF | ON | OFF | OFF | OFF | OFF | OFF | ON | OFF | Z |
| 1 | 0 | 0 | 1 | OFF | OFF | ON | ON | ON | ON | OFF | OFF | OFF | ON | ON | ON | OFF | Z |
| 1 | 0 | 1 | 0 | ON | OFF | OFF | ON | OFF | ON | OFF | OFF | OFF | OFF | OFF | ON | OFF | Z |
| 1 | 0 | 1 | 1 | OFF | OFF | OFF | ON | ON | ON | OFF | OFF | OFF | ON | ON | ON | OFF | Z |

Fig. 6b

NOR TRI-STATE

| EN_ | EN | IN1 | IN2 | 2 | 44 | 10 | 22 | 16 | 42 | 14 | 6 | 40 | 4 | 12 | 18 | 8 | OUT |
|---|---|---|---|---|---|---|---|---|---|---|---|---|---|---|---|---|---|
| 0 | 1 | 0 | 0 | ON | ON | ON | OFF | OFF | OFF | OFF+ | ON- | ON | OFF | OFF | ON | OFF | 1 |
| 0 | 1 | 0 | 1 | OFF | ON | ON | OFF | ON | OFF | ON- | OFF | ON | ON | OFF | ON | ON- | 0 |
| 0 | 1 | 1 | 0 | ON | ON | OFF | ON | OFF | OFF | ON- | OFF | ON | OFF | ON | ON | ON- | 0 |
| 0 | 1 | 1 | 1 | OFF | ON | OFF | ON | ON | OFF | ON- | OFF | ON | ON | ON | ON | ON- | 0 |
| 1 | 0 | 0 | 0 | ON | OFF | ON | OFF | OFF | ON | OFF | OFF | OFF | OFF | OFF | ON | OFF | Z |
| 1 | 0 | 0 | 1 | OFF | OFF | ON | OFF | ON | ON | OFF | OFF | OFF | ON | OFF | ON | OFF | Z |
| 1 | 0 | 1 | 0 | ON | OFF | OFF | ON | OFF | ON | OFF | OFF | OFF | OFF | ON | ON | OFF | Z |
| 1 | 0 | 1 | 1 | OFF | OFF | OFF | ON | ON | ON | OFF | OFF | OFF | ON | ON | ON | OFF | Z |

BICMOS TRI-STATE CIRCUIT WITH FULL OUTPUT VOLTAGE SWING

This application is a Continuation of application Ser. No. 07/989,929, filed Dec. 11, 1992 now abandoned which is a continuation of Ser. No. 07/758,434, filed Sep. 3, 1991, now abandoned which is a continuation of Ser. No. 07/540,542 filed Jun. 19, 1990 and now abandoned.

BACKGROUND OF THE INVENTION

Traditionally, a multiplexer is used to select a signal from among a number of inputs. However, as this number increases, the speed of the multiplexer decreases and the physical size (area) of the multiplexer increases, resulting in consumption of valuable space. A tri-state scheme of selection would be more desirable than multiplex selection, particularly, if multiplex selection must be made from greater than 8 inputs. However, tri-state schemes generally impart more loading on a bus connected to tri-state driver outputs than desired such that the output bus line switching speed is decreased. Furthermore, tri-state circuits which do not have rail-to-rail voltage output swings, generally consume a significant amount of d.c. power. Therefore, a need exists to increase the switching speed of a tri-state circuit. Additionally, a need exists to significantly decrease d.c. power consumption by tri-state circuits which do not have full voltage output swings.

OBJECTS OF THE INVENTION

It is an object of the invention to provide a new and improved BiCMOS tri-state driver circuit.

It is another object of the invention to provide a new and improved selection system using Bi-CMOS tri-state driver circuits.

These and other objects of the invention, together with the features and advantages thereof, will become apparent from the following detailed specification when read together with the accompanying drawings in which applicable reference numerals have been carried forward.

SUMMARY OF THE INVENTION

The foregoing objects of the invention are provided by two switches, each of which are connected to associated bipolar transistors of a totem pole connected pair. The switches when turned on, are capable of turning their associated bipolar transistors off. A first bipolar transistor of the pair is controlled by the state of an enable signal. A switch is connected across the first bipolar transistor so as to be capable of driving the circuit's output to a predetermined voltage when the circuit is enabled and a predetermined input is received by the circuit. The switch connected across the first bipolar transistor and the switch connected to the first bipolar transistor operate in a complementary fashion (i.e. when one is on, the other is off). The invention eliminates current leakage from the output when the circuit is disabled and provides a full output voltage swing.

BRIEF DESCRIPTION OF THE DRAWINGS

FIG. 2 is a chart showing the relative on and off states of transistors in response to EN, EN_, and IN signals.

FIG. 3 illustrates a truth table of the output OUT in relation to the voltage, logic high or logic low, at signals EN, EN_ and IN.

FIG. 4 illustrates a schematic drawing of the tri-state circuit with functional logic.

FIG. 5a illustrates a functional equivalent of the invention implementing inverting tri-state logic.

FIG. 5b represents a voltage vs. time plot of a simulation of an embodiment of the invention carrying out inverting functionality as shown in FIG. 5a.

FIG. 6b illustrates a corresponding operation table for the circuit of FIG. 7a showing the on/off states of transistors and both binary input/output and enable/disable signals.

FIG. 7b illustrates a corresponding operation table for FIG. 7a showing the on/off states of transistors and both binary input/output and enable/disable signals.

DETAILED DESCRIPTION OF THE INVENTION

Figure 1:
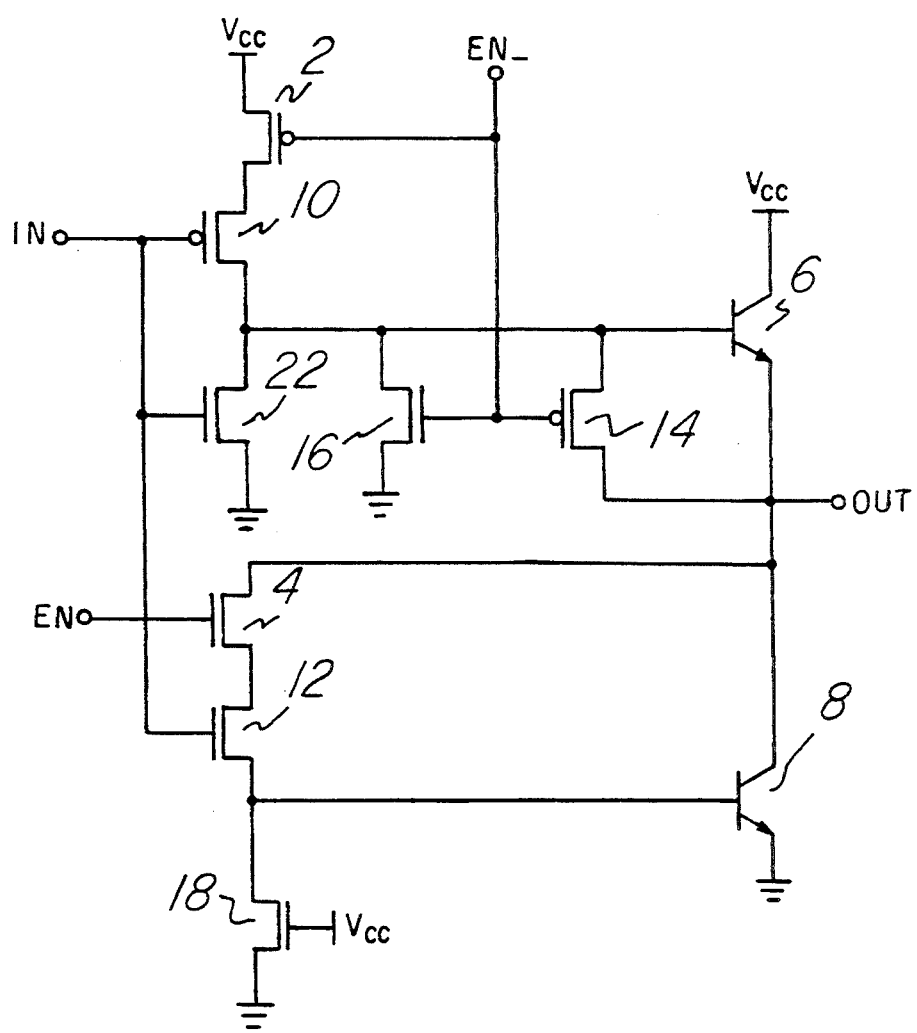
FIG. 1 illustrates a schematic drawing of a first preferred embodiment of the BiCMOS tri-state circuit.

FIG. 1 illustrates a schematic drawing of a first preferred embodiment of the BiCMOS tri-state circuit. Tri-state control signals EN and EN_ the complement of signal EN, can be generated by an inverter. Assuming signal EN is at logic low and its complement, signal EN_ is at logic high, p-channel transistor 2 and n-channel transistor 4, whose gates are connected to EN_ and EN, respectively, are turned off. Therefore, no base current flows to bipolar pull-up transistor 6 or bipolar pull-down transistor 8, connected by the emitter and the collector, respectively, to output OUT. Base current fails to flow in transistor 6 due to the isolation of supply voltage Vcc by turned off transistor 2 from p-channel input transistor 10 which is connected at its drain to the base of transistor 6 and connected at its source to the drain of transistor 10. Base current does not flow in transistor 8 due to input n-channel transistor 12, whose drain is connected to the drain of turned off transistor 4 and whose source is connected to the base of transistor 8. P-channel transistor 14 which has one source/drain connected to n-channel transistor 16 prevents false triggering of transistor 6. N-channel transistor 18 has its gate connected to supply voltage Vcc, its drain connected to the base of transistor 8 and its source connected to circuit ground. Likewise, transistor 18 maintains the base of transistor 8 near ground and prevents false triggering of transistor 8. However, transistor 8 will turn on temporarily to discharge a high logic level previous output after the circuit's current input and EN signal are logic high. The foregoing described circuit conditions exist irrespective of the voltage at the common input signal IN to gates of transistors 10 and 12.

Assuming signal EN is at logic high, its complement, EN_ at logic low and input signal IN at logic low, transistors 2 and 10 turn on to provide base current to transistor 6. Transistor 6 pulls the voltage at output OUT up to one base emitter voltage drop shy of Vcc in response to the base current supplied by transistors 2 and 10. Transistor 14 gradually charges output OUT.

Eventually transistor 14 will pull output OUT up to supply voltage Vcc, thus turning off transistor 6. Assuming that input signal IN changes to logic high and that the initial output voltage is at Vcc, transistors 4 and 12 turn on to provide base current to transistor 8.

A primary advantage of the invention is its ability to eliminate current leakage from the circuit's output to the rest of the circuit by providing a first switch, i.e. transistor 14, across the first transistor of a bipolar pair of transistors connected in a totem pole fashion (i.e. transistor 6 of totem pole pair comprising transistors 6 and 8) together with a second switch, (i.e. transistor 16) which operates in complementary fashion with the first switch, i.e. when one transistor is on, the other is off. Both first and second switches are controlled by the state of the circuit's enable signal. When the first switch is on, it aids in bringing the output up to substantially the circuit supply voltage. A third switch (i.e. transistor 18) connected across the second transistor of the bipolar pair, which is always on, functions as a resistor. Thus, when the circuit is disabled, the second transistor of the bipolar pair is turned off. The first and third switches provide full output voltage swing to drive other circuits. The first transistor provides the upper swing limit (i.e. Vcc, the circuit supply voltage) and the third transistor provides the lower swing limit (i.e. circuit ground). Thus d.c. power consumption is minimized. Therefore any other circuity can be driven without substantial loss of d.c. power from stage to stage. The circuit of FIG. 1 was implemented in a 0.8 micro meter (um) BiCMOS technology experimental prototype having the following transistor sizes: transistors 2 and 10=15.6 (um), transistor 14=2.7 um, transistors 16 and 22=3.2 um, transistors 4 and 12=13 um transistor 18=1.5 um and transistors 6 and 8=4.48 um2.

FIG. 2 is a chart showing the relative on and off states of transistors in response to EN, EN_, and IN signals. On-means on initially and off eventually at steady state. OFF+ means off initially and on eventually at steady state.

FIG. 3 illustrates a truth table of the output OUT in relation to the voltage, logic high or logic low, at signals EN, EN_ and IN.

The tri-state function of the circuit of FIG. 1 can be implemented independent of the logic implemented by transistors 10, 12, and 22. FIG. 4, a schematic drawing of a second preferred embodiment of the invention, illustrates such a scheme with transistors 10, 12 and 22 of FIG. 1, replaced by functional logic circuits 30, 32 and 34 respectively. Functional logic circuits 30, 32 and 34 each comprise the appropriate network including transistors, which are required to implement a desired logic function in a circuit with tri-state capability. This means logic functions including AOI (AND-OR-INVERT), NOR, OAI (OR-AND-INVERT), and NAND can be implemented with the invention. For example, a NAND gate tri-state driver can be implemented with the following: circuit 32 and 34 each comprising two n-channel transistors having the source of a first n-channel transistor connected to the drain of a second n-channel transistor; and circuit 30 comprising two p-channel transistors having each source connected together and each drain connected together. The foregoing combines logic functionality and tri-state functionality in a single gate, the advantage of which is shorter delay in comparison with multiple levels of logic using a stand alone tri-state driver.

FIG. 5a illustrates a functional equivalent of the invention implementing inverting tri-state logic with inverters 40 and 42. Signal IN1 is input into inverter 40 and signal IN2 is input into inverter 42. Enabling signal EN and its complement, signal EN_, control the output at node OUT among a logic high state, a logic low state, and a high impedance state as discussed previously. In accordance with common logic symbol representation, a small circle preceding a line signifies complementation of an input signal.

Figure 5B:
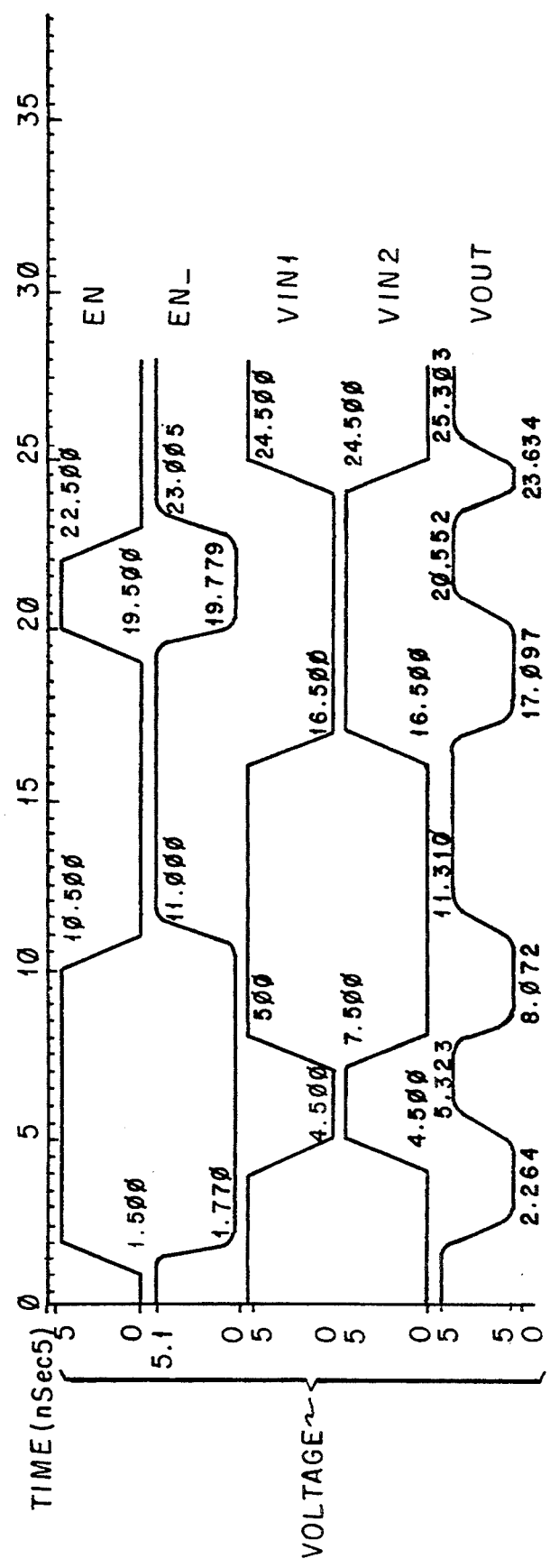

FIG. 5b represents a voltage vs. time plot of a simulation of an embodiment of the invention carrying out inverting functionality as shown in FIG. 5a. Time is shown in nanoseconds (nsecs) starting from time, t, equal 0 nsecs to t=50 nsecs. High and low points along the graphs are marked as shown in accordance with their time of occurrence. The voltage levels of signal EN and input voltages to inverters 40 and 42, VIN1 and VIN2, respectively, range from 0.0 volts to 5.0 volts. The voltage of signal EN_ ranges from 0.0 volts to 5.1 volts. The input voltages into inverters 40 and 42, VIN1 and VIN2 respectively, range from 0.0 volts to 5.0 volts respectively. The output voltage at node OUT ranges from 0.5 volts to 5.0 volts.

Figure 6A:
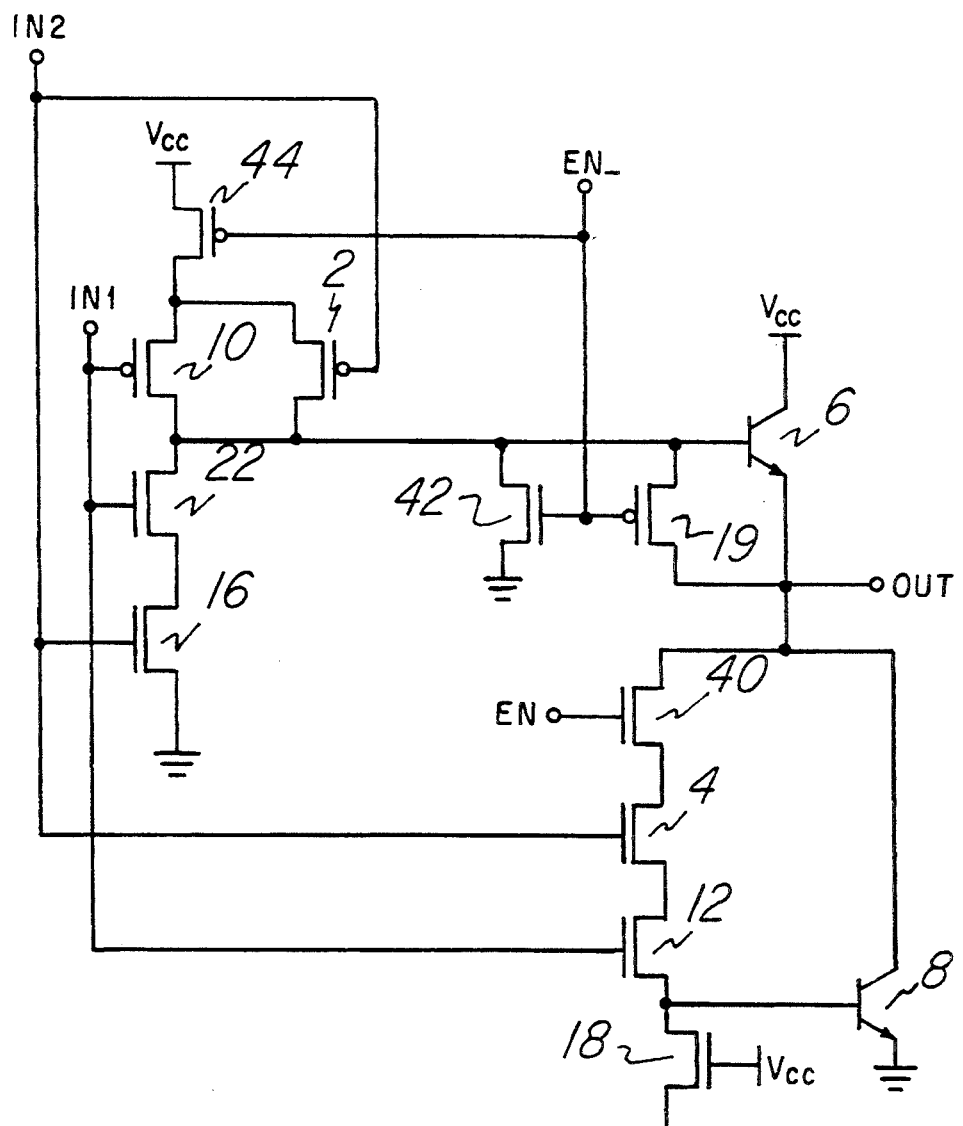
FIG. 6a illustrates a schematic drawing of an alternative embodiment of the invention implementing NAND logic.

FIG. 6a illustrates a schematic drawing of an alternative embodiment of the invention implementing NAND logic. Its corresponding operation table showing the on/off states of transistors and both binary input/output and enable/disable signals is illustrated in FIG. 6b.

Figure 7A:
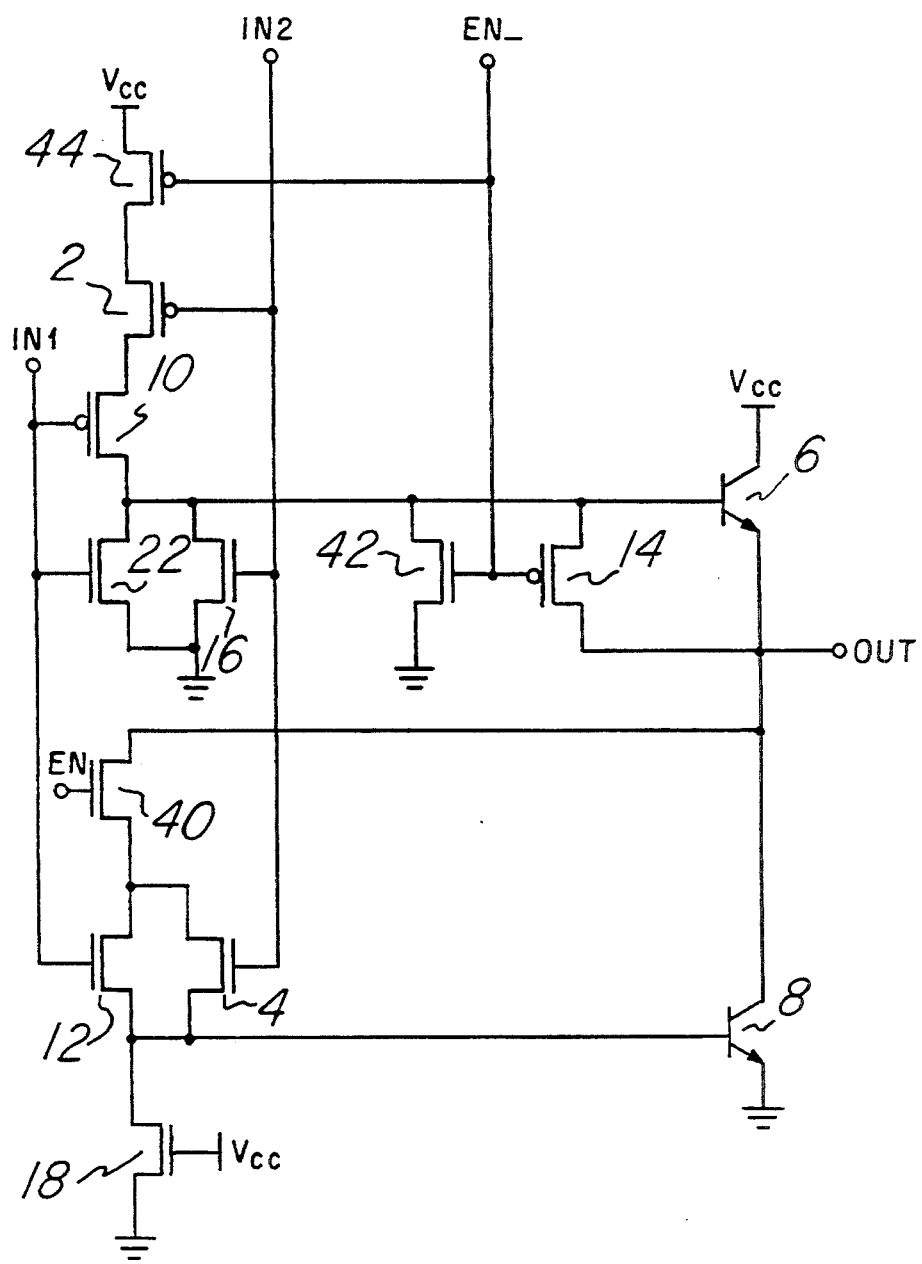
FIG. 7a illustrates a schematic drawing of an alternative embodiment of the invention implementing NOR logic.

FIG. 7a illustrates a schematic drawing of an alternative embodiment of the invention implementing NOR logic. Its corresponding operation table showing the on/off states of transistors and both binary input/output and enable/disable signals is illustrated in FIG. 7b.

Although the invention has been described in detailed herein with reference to its preferred embodiment, it is to be understood that this description is by way of example only and is not to be construed in a limiting sense. It is to be further understood that numerous changes in the details of the embodiments of the invention, and additional embodiments of the invention, will be apparent to, and may be made by persons of ordinary skill in the art having reference to this description. It is contemplated that all such changes and additional embodiments are within the true scope and spirit of the invention as claimed below.

We claim:

1. A tri-state circuit comprising:

a first bipolar transistor having an emitter connected to a reference potential, a base and a collector connected to an output terminal;

a second bipolar transistor having an emitter connected to said output terminal, a base and a collector connected to a first potential, both said first and second bipolar transistors having a first conductivity configuration such that said first and second bipolar transistors are conductive when a potential having a sign correlating the difference between said reference potential subtracted from said first potential relative is applied from said base to said emitter;

a pull-down load having a first terminal connected to said base of said first bipolar transistor and a second terminal connected to said reference potential;

a first switch having a first current handling terminal connected to said base of said first bipolar transistor, a second current handling terminal and a control terminal connected to an input terminal, said first switch having a first switch type wherein said first switch is conductive when a potential having a sign correlating the difference between said reference potential subtracted from said first potential relative is applied to said control terminal;

a second switch having said first type and having a first current handling terminal connected to said second current handling terminal of said first switch, a second current handling terminal connected to said output terminal and a control terminal connected to receive an enable signal;

a third switch having said first type and having a first current handling terminal connected to said reference potential, a second current handling terminal connected to said base of said second bipolar transistor and a control terminal connected to said input terminal;

a fourth switch having said first type and having a first current handling terminal connected to said reference potential, a second current handling terminal connected to said base of said second bipolar transistor and a control terminal connected to receive the inverse of said enable signal;

a fifth switch having a first current handling terminal connected to said base of said second bipolar transistor, a second current handling terminal and a control terminal connected to said input terminal, said fifth switch having a second type wherein said fifth switch is conductive when a potential having a sign opposite the difference between said reference potential subtracted from said first potential relative is applied to said control terminal;

a sixth switch having said second type and having a first current handling terminal connected to said second current handling terminal of said fifth switch, a second current handling terminal connected to said first potential and a control terminal connected to receive said inverse of said enable signal; and a seventh switch having said second type and having a first current handling terminal connected to said base of said second bipolar transistor, a second current handling terminal connected to said output terminal and a control terminal connected to receive said inverse of said enable signal.

2. A tri-state circuit as in claim 1 wherein said first potential is more positive than said reference potential.

3. A tri-state circuit as in claim 1 wherein said first and second bipolar transistors are NPN transistors.

4. A tri-state circuit as in claim 1 wherein said first, second, third and fourth switches are field effect transistors.

5. A tri-state circuit as in claim 4 wherein said first type is N-channel.

6. A tri-state circuit as in claim 2 wherein said fifth, sixth and seventh switches are field effect transistors.

7. A tri-state circuit as in claim 6 wherein said first type is P-channel.

8. A tri-state circuit as in claim 1 wherein said pull-down load is a field effect transistor having a source as said first terminal and a drain as said second terminal and having a gate connected to said first potential.

9. A tri-state circuit comprising:

a first bipolar transistor having an emitter connected to a reference potential, a base and a collector connected to an output terminal;

a second bipolar transistor having an emitter connected to said output terminal, a base and a collector connected to a first potential, both said first and second bipolar transistors having a first conductivity configuration such that said first and second bipolar transistors are conductive when a potential having a sign correlating the difference between said reference potential subtracted from said first potential relative is applied from said base to said emitter;

a pull-down load having a first terminal connected to said base of said first bipolar transistor and a second terminal connected to said reference potential;

a first logic gate having an output terminal connected to said base of said first bipolar transistor, a pull-up terminal and at least two input terminals connected to receive input signals;

a first switch having a first current handling terminal connected to said pull-up terminal of said first logic gate, a second current handling terminal connected to said output terminal and a control terminal connected to receive an enable signal, said first switch having a first switch type wherein said first switch is conductive when a potential having a sign correlating the difference between said reference potential subtracted from said first potential relative is applied to said control terminal;

a second logic gate having a pull-down terminal connected to said reference potential, having an output terminal connected to said base of said second bipolar transistor, having at least two input terminals connected to receive said input signals and having a pull-up terminal;

a second switch having said first type and having a first current handling terminal connected to said reference potential, a second current handling terminal connected to said base of said second bipolar transistor and a control terminal connected to receive the inverse of said enable signal;

a third switch having a first current handling terminal connected to said first potential, a second current handling terminal connected to said pull-up terminal of said second logic gate and a control terminal connected to said inverse of said enable signal, said third switch having a second type wherein said third switch is conductive when a potential having a sign opposite the difference between said reference potential subtracted from said first potential relative is applied to said control terminal;

a fourth switch having said second type and having a first current handling terminal connected to said base of said second bipolar transistor, a second current handling terminal connected to said output terminal and a control terminal connected to receive said inverse of said enable signal.

10. A tri-state circuit as in claim 9 wherein said first potential is more positive than said reference potential.

11. A tri-state circuit as in claim 9 wherein said first and second bipolar transistors are NPN transistors.

12. A tri-state circuit as in claim 9 wherein said first and second switches are field effect transistors.

13. A tri-state circuit as in claim 12 wherein said first type is N-channel.

14. A tri-state circuit as in claim 9 wherein said third and fourth switches are field effect transistors.

15. A tri-state circuit as in claim 14 wherein said first type is P-channel.

16. A tri-state circuit as in claim 9 wherein said pull-down load is a field effect transistor having a source as said first terminal and a drain as said second terminal and having a gate connected to said first potential.

17. A tri-state circuit as in claim 9 wherein said first and second logic gates are AND gates.

* * * * *